United States Patent [19]

Sakuma

[11] Patent Number: 4,677,317
[45] Date of Patent: Jun. 30, 1987

[54] HIGH VOLTAGE SIGNAL OUTPUT CIRCUIT PROVIDED WITH LOW VOLTAGE DRIVE SIGNAL PROCESSING STAGES

[75] Inventor: Hiraku Sakuma, Tokyo, Japan

[73] Assignee: NEC Corporation, Tokyo, Japan

[21] Appl. No.: 706,666

[22] Filed: Feb. 28, 1985

[30] Foreign Application Priority Data

Feb. 29, 1984 [JP] Japan .................................. 59-38024

[51] Int. Cl.$^4$ ..................... H03K 17/10; H03K 17/16
[52] U.S. Cl. ................................ 307/443; 307/200 B; 307/451; 307/475; 307/246; 307/270
[58] Field of Search .................... 340/771–779, 340/805, 813; 315/169.2, 169.4; 307/200 B, 443, 450, 451, 452, 475, 246, 571, 584, 585, 264, 270; 377/70, 74

[56] References Cited

U.S. PATENT DOCUMENTS

| | | | |
|---|---|---|---|
| 4,032,818 | 6/1977 | Chan | 315/169.2 |
| 4,070,600 | 1/1978 | Butler et al. | 340/771 |
| 4,200,868 | 4/1980 | Lamoureux et al. | 340/771 X |
| 4,370,651 | 1/1983 | Reible, Jr. | 340/777 X |
| 4,503,342 | 3/1985 | Adam | 307/475 |
| 4,527,074 | 7/1985 | Donaldson et al. | 307/246 |
| 4,532,506 | 7/1985 | Kitazima et al. | 340/805 X |
| 4,571,527 | 2/1986 | Martin | 315/169.4 |
| 4,572,972 | 2/1986 | Shoji | 307/453 X |

Primary Examiner—Stanley D. Miller
Assistant Examiner—D. R. Hudspeth
Attorney, Agent, or Firm—Burns, Doane, Swecker & Mathis

[57] ABSTRACT

A high voltage signal producing circuit, such as a panel display driver, includes an input terminal receiving an input signal, a first signal processor receiving the input signal through a conductive line, a second signal processor receiving the input signal through a capacitor, at least one output stage in which P- and N-channel MOS output transistors are connected in series, one of the MOS output transistors receiving a signal from the first signal processor in response to the input signal and the other of the MOS output transistors receiving a signal from the second signal processor in response to the input signal, a high voltage power source energizing the output stage, a first low voltage power source energizing the first signal processor and a second low voltage power source energizing the second signal processor.

8 Claims, 7 Drawing Figures

HIGH VOLTAGE SIGNAL OUTPUT CIRCUIT PROVIDED WITH LOW VOLTAGE DRIVE SIGNAL PROCESSING STAGES

BACKGROUND OF THE INVENTION

1. Field of the Invention

This invention relates to an electrical circuit for outputting a high voltage signal, and more particularly to an electrical circuit suited for being formed in a semiconductor integrated circuit.

2. Description of the Prior Art

The present invention will be hereinafter explained with respect to flat panel displays, such as a PDP (Plasma Display Panel), an ELD (Electroluminescence Display) and a dot matrix VFD (Vacuum Fluorescent Display), as the apparatus in which the electrical circuit according to the present invention is used. In accordance with the recent development of office automation, the flat panel displays are desired for practical use. Those flat panel displays are driven with a high voltage (100~250 volts) signal. Moreover, such driving signal must be applied for each one of the dots in the panel displays. In other words, in a panel display having display dots of a matrix of 512×512, 1024 high voltage drive circuits are necessary. Many problems in manufacturing cost, size and power consumption have arisen in the manufacture of such a large number of high voltage drive circuits, especially in manufacturing them in the form of an integrated circuit.

More specifically, the circuit might be formed by a C-MOS output circuit in which P- and N-channel MOS FET's are connected in series between high voltage power terminals. An input signal was applied to the gates of the two MOS FET's, after it was subjected to signal processing for driving the panel displays. This idea was not practical, because the achievement of a high gate withstand voltage, i.e. threshold voltage, required for the two MOS FET's was very difficult. An improvement of the C-MOS output circuit has been proposed which used two inverters to apply appropriately biased input signals to the respective gates of the P- and N-channel MOS FET's in the C-MOS output circuit. After an input signal was subjected to signal processing, it was applied to the gate of the N-channel MOS FET in the C-MOS output circuit through an inverter, while it was once applied to another inverter composed of an N-channel MOS FET and two series-connected load resistors and then applied to the gate of the P-channel MOS FET from the connecting point of the two load resistors. The voltage swing at the gates of the C-MOS output circuit was made small by the inverters, resulting in the formation of a C-MOS output circuit with P- and N-channel MOS FET's having lower gate withstand voltages. This improvement, however, had some other problems including a relatively low operation speed due to time delays in the inverters and a large power consumption in the series-connected load resistors.

A further improvement was proposed in Japanese Unexamined Patent Publication No. 55-136726 by the inventor of the present invention and its application to a semiconductor integrated circuit has been announced in "IEDM Technical Digest '82" pages 254 to 257. After an input signal was subjected to many signal processings, it was applied to the gate of an N-channel MOS FET in the C-MOS output circuit, while it was applied through a capacitor to the gate of a P-channel MOS FET in which a parallel circuit of a forward-biased diode and a resistor was connected between the gate and the source thereof. Since the gate of the P-channel MOS FET was biased by the parallel circuit, very little power was consumed by the resistor, resulting in savings in power. Furthermore, the input signal was transmitted to the gate of the P-channel MOS FET through a capacitor only, resulting in high speed operability.

However, the capacitor is an element which is hard to form in a semiconductor integrated circuit. The usage of such a capacitor created a new problem that the whole circuit could not be formed in a semiconductor integrated circuit and that, when the circuit was formed in a semiconductor integrated circuit, a large number of external circuit elements, such as the capacitors, and external wirings could not be avoided to drive a large number of dots in a panel display. The number of external circuit elements and external wirings caused an increase in cost and a made it impossible to have a compact circuit.

SUMMARY OF THE INVENTION

The primary object of the present invention is to provide a circuit for outputting a high voltage signal which is suited for being formed in a semiconductor integrated circuit.

Another object of the present invention is to provide a circuit for producing a high voltage signal which is operable at high speed and has a low power consumption.

Still another object of the present invention is to provide a circuit for driving a plurality of display dots with a small number of circuit elements and circuit wirings to allow the driver for the displays to be compact with a low cost.

According to the present invention, there is provided a circuit for outputting a high voltage signal which comprises a high power voltage source, first and second low power voltage sources, an input terminal for receiving an input signal, a first signal processing circuit energized by the first low power voltage source in which the input signal is subjected to a first signal processing, a second signal processing circuit energized by the second power voltage source, a capacitor for applying the input signal received at the input terminal to the second signal processing circuit, the input signal received at the second signal processing circuit being subjected to a second signal processing therein, at least one output stage of P- and N-channel MOS field effect transistors connected in series to be energized by the high power voltage source, the gate of one of the P- and N-channel MOS field effect transistors receiving a processed input signal from the first signal processing circuit, and the gate of the other MOS field effect transistor receiving another processed input signal from the second signal processing circuit, and an output terminal for deriving an output signal from the output stages. For driving a panel display having a plurality of display dots, the circuit comprises a plurality of output stages and a plurality of corresponding output terminals, each of the output signals obtained at the respective output terminals driving corresponding one of the corresponding display dots.

In the circuit according to the present invention, an input signal is applied to the first signal processing circuit and to the second signal processing circuit through the capacitor, and then subjected to first and second signal processing. Therefore, only one capacitor is required to produce the output signal. If a plurality of output stages and output terminals are provided to produce a plurality of output signals, the requirement of only one capacitor is unchanged. Other circuit elements can be formed on a semiconductor chip. Therefore, the whole circuit is easily formed in the form of a semiconductor integrated circuit with one external capacitor and its wirings. The gates of the P- and N-channel MOS field effect transistors in the output stage are driven by the both first signal processing circuit which is energized by the first low power voltage source and the second signal processing circuit which is energized by the second low power voltage source. The gate withstand voltages required for the P- and N-channel MOS field effect transistors in the output stage are not very high. This fact is another reason for forming the whole circuit in a semiconductor integrated circuit. The above-mentioned one-capacitor requirement allows the formation of a compact circuit with low cost.

As to the operation speed, the time delays may occur in the first and second signal processing circuits. A similar signal processing circuit, however, was used prior to the input terminal of the driver in the prior art. Only the position of the signal processing circuit is changed in the circuit of the present invention. There is no circuit element which causes an additional time delay. Therefore, the high speed operation is not harmed by the circuit arrangement of the present invention.

BRIEF DESCRIPTION OF THE DRAWINGS

The above and further objects, features and advantages of the present invention will become more apparent from the following detailed description taken in conjunction with the accompanying drawings, wherein.

Figure 1:
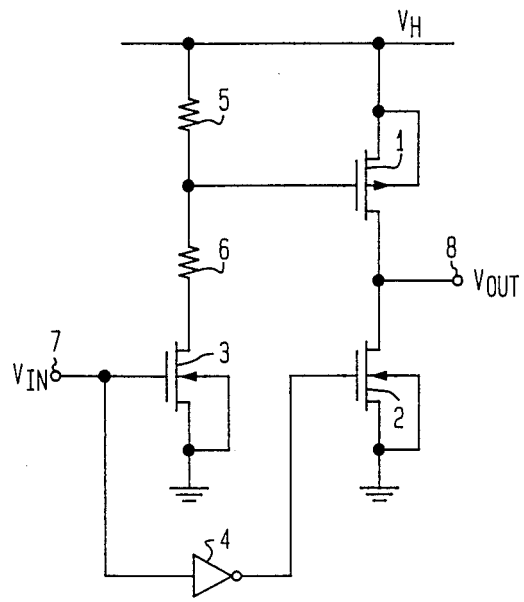
FIG. 1 is a circuit diagram showing a first example of a high voltage signal producing circuit in the prior art.

The first example of the high voltage signal producing circuit used a first inverter 4 and a second inverter composed of a MOS FET 3 and two resistors 5 and 6, as shown in FIG. 1. The gates of the P- and N-channel MOS FET's 1 and 2 received an input signal at the input terminal 7 through different ways, respectively. That is, while the input signal was applied to the gate of the N-channel MOS FET 2 through the first inverter, it was first applied to the gate of the MOS FET 3 and then applied to the gate of the P-channel MOS FET 1 from the connecting point of the resistors 5 and 6.

Prior to the application of the input signal to the input terminal 7, it was subjected to signal processings for driving a panel display, such as a time delay treatment. After the treatment of the circuit shown in FIG. 1, an output signal was derived from an output terminal 8 to drive one display element in the panel display. Therefore, for driving all the display elements, the same number of circuits shown in FIG. 1 as the number of display elements were required.

The circuit shown in FIG. 1 has a merit that, because the levels of the signal to be applied to the gates of the MOS FET's 1 and 2 were respectively controlled by the first inverter 4 and the second inverter (3, 5 and 6), high gate withstand voltages were not required for the MOS FET's 1 and 2. However, the usage of the first and second inverters caused additional time delays of the input signal. That is, although a high speed operation is required for a clear image of the panel display, the circuit in the prior art could not drive at a high enough speed so that the clear image was obtained.

Furthermore, the resistors 5 and 6 consumed a considerable power amount of power. When the panel display having a large number of display elements was driven by a combination of the circuits shown in FIG. 1, a large amount of power was consumed. From a practical point of view, the low operation speed and the large power consumption spoiled the applicability of the circuit shown in FIG. 1 to the panel displays.

Figure 2:
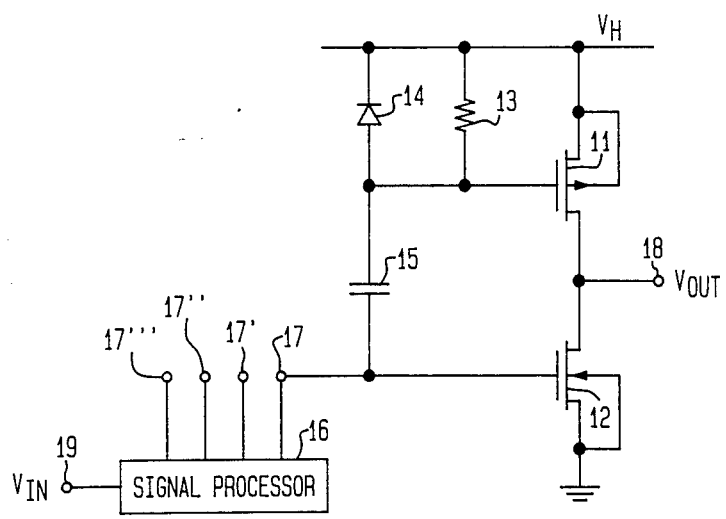
FIG. 2 is a circuit diagram showing a second example of a high voltage signal producing circuit in the prior art.

The low operating speed and the large power consumption have been improved in the circuit shown in FIG. 2 which has been proposed in Japanese Unexamined Patent Publication No. 55-136726 by the same inventor. After an input signal at the input terminal 19 was subjected to an appropriate signal processing by a signal processor 16, it was applied to the terminal 17 and then applied to a gate of an N-channel MOS FET 12 directly, and to a gate of a P-channel MOS FET 11 through a capacitor 15. While the gate of the N-channel MOS FET 12 was biased by the input signal at the terminal 17, the gate of the P-channel MOS FET 11 was biased by a resistor 13 and a diode 14 which were connected in parallel with the gate-source of the P-channel MOS FET 11. The output signal at the output terminal was used for driving one display element in a panel display device.

For driving a large number of display elements, a large number of the circuits shown in FIG. 2 were used. The respective circuits received the processed input signals from the signal processor 16 through the respective terminals 17′, 17″, 17‴ .... The signal processor 16 was made of a circuit for applying time delay to the input signal and a latch, and controlled the driving timings of the respective display elements.

Since an inverter was not used in the circuit of FIG. 2, no additional time delay was generated in the circuit, resulting in an operability at high speed. Moreover, the gates of the MOS FET's 11 and 12 were connected by the capacitor. There was no D.C. current path between the power terminals, resulting in low power consumption.

Many difficulties arose in the formation of the circuit in the form of a semiconductor integrated circuit. Since the input signal was applied to the terminals 17, 17′, 17″ .... After the signal processing by the signal processor 16, a large number of the circuits shown in FIG. 1 were required. The whole circuit including the signal processor 16 and the large number of circuits shown in FIG. 2 was impossible due to the presence of the capacitor 15. The proposal in "IEDM Technical Digest '82" (pages 254 to 257) was such that a large number of P-channel MOS FET's 11, resistors 13, and diodes 14 are formed in a semiconductor chip, while a large number of N-channel MOS FET's 12 and the signal processor 16 are formed in another semiconductor chip. The drains of the respective MOS FET's 11 and 12 are externally wired to the corresponding output terminals 18. The gates of the respective MOS FET's 11 and 12 are wired through an external capacitor 15.

The structure of such a proposal required a large number of capacitors and circuit wirings as external elements and a large number of electrode pads on each of the semiconductor chips. The large number of external elements made the driving apparatus of the panel display very expensive and made it troublesome to manufacture the same. The large number of electrode pads made the semiconductor chips very wide and the formation of the semiconductor integrated circuit practically impossible.

DESCRIPTION OF THE PREFERRED EMBODIMENT

Figure 3:
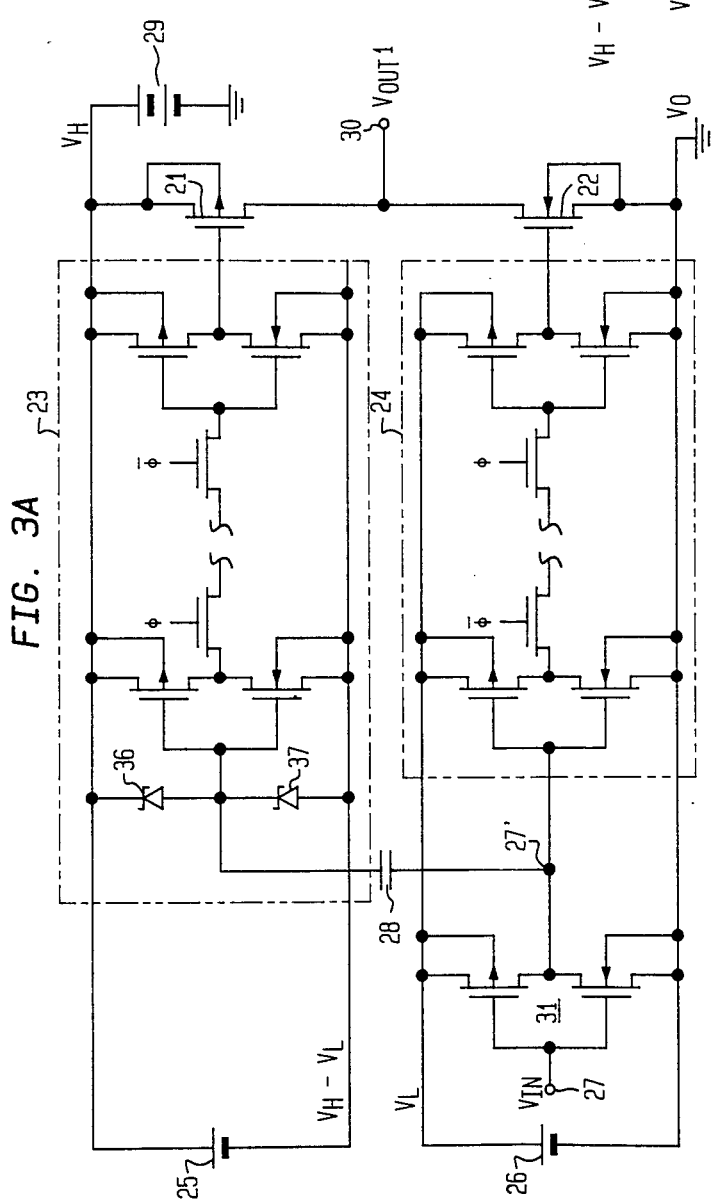
FIG. 3(a) is a circuit diagram showing a preferred embodiment of the present invention.
FIG. 3(b) is a circuit diagram of an additional circuit applicable to the circuit of FIG. 3(a)

In accordance with the preferred embodiment shown in FIG. 3(a), an input signal Vin is received at an input terminal 27 and transmitted to the terminal 27' through a buffer amplifier 31 of complementary MOS FET's. The signal at the terminal 27' is directly applied to a first signal processor 24. It is also applied to a second signal processor 23 through a capacitor 28 having a capacitance of 1,000 pF, for example. Each of the signal processors 23 and 24 are composed of a plurality of complementary MOS transistors and MOS type transfer gates. A D.C. bias is applied to the input end of the signal processor 23 by zener diodes 36 and 37. While the buffer amplifier 31 and the signal processor 24 are energized by a low voltage power source 26 of 10 volts, for example, the signal processor 23 is energized by a low voltage power source 25 of 10 volts, for example. An example of the signal processors 23 and 24 are a shift register or other function circuit. The shift register is driven by clock pulses $\phi$ and $\bar{\phi}$. The output from the signal processor 23 is applied to a gate of a P-channel MOS FET 21. The output from the other signal processor 24 is applied to a gate of an N-channel MOS FET 22. The respective source-drain paths of the P- and N-channel MOS FET's 21 and 22 are connected in series and energized by a high voltage power source 29 of 200 volts, for example. An output signal $V_{out1}$ is produced at an output terminal 30 connected with the drains of the P- and N-channel MOS FET's 21 and 22.

In a case where another output signal $V_{out2}$ is required to be produced in response to the same input signal $V_{in}$, another output stage of P- and N-channel MOS FET's 21' and 22' is added as shown in FIG. 3(b) to produce another output signal $V_{out2}$ at another output terminal 30'. A signal is derived from a suitable portion of the signal processor 23 to be applied to the gate of the P-channel MOS FET 21'. Another signal is also derived from a suitable portion of the signal processor 24 to be applied to the gate of the N-channel MOS FET 22'.

According to the preferred embodiment, some time delays occur in the signal processors 23 and 24. But similar signal processor was required in the preceeding stage of the terminal 27' in the circuit of the prior art. Only the position of the signal processor is changed, compared to the prior art circuit. Therefore, any additional time delay is not generated in the circuit of the preferred embodiment. In this way, the high speed operability is not deteriorated. There is no D.C. current path. The power consumption is also held similar to that of the prior art circuit shown in FIG. 2. Another merit of the preferred embodiment is a wide variety of operations of the P- and N-channel MOS FET's 21 and 22.

The prior art circuits operated the corresponding output MOS FET's in a determined relationship. The MOS FET's 21 and 22, however, may be independently operated. For example, both of them may be driven into cut-off condition by the arrangement of the signal processors 23 and 24.

As explained with reference to FIG. 3(b), only one capacitor is required for producing a plurality of output signals. All other circuit elements can be formed on a one or two semiconductor chip. That is, the number of expensive circuit element such as the capacitor is only one. The whole circuit can be formed with a small number of circuit elements and with a low cost.

The compactness of the circuit is effectively achieved by forming it in the form of an integrated circuit device. The signal processor 23 and one or a plurality of P-channel MOS FET's 21, 21' may be formed on a one semiconductor chip. The buffer amplifier 31, the signal processor 24 and one or a plurality of N-channel MOS FET's 22, 22' may also be formed on another one semiconductor chip. These semiconductor integrated circuits are interconnected by one external capacitor 28 and one or a plurality of wirings for connecting drains of P-channel MOS FET(s) 21 (21') and N-channel MOS FET(s) 22 (22'). The numbers of external capacitor and the wiring(s) are at a minimum, and thus the numbers of electrode pads required for the respective semiconductor chips are also at a minimum. The whole circuit is easily formed in a the form of an integrated circuit with a minimum number of the external capacitor and wirings.

Figure 4:
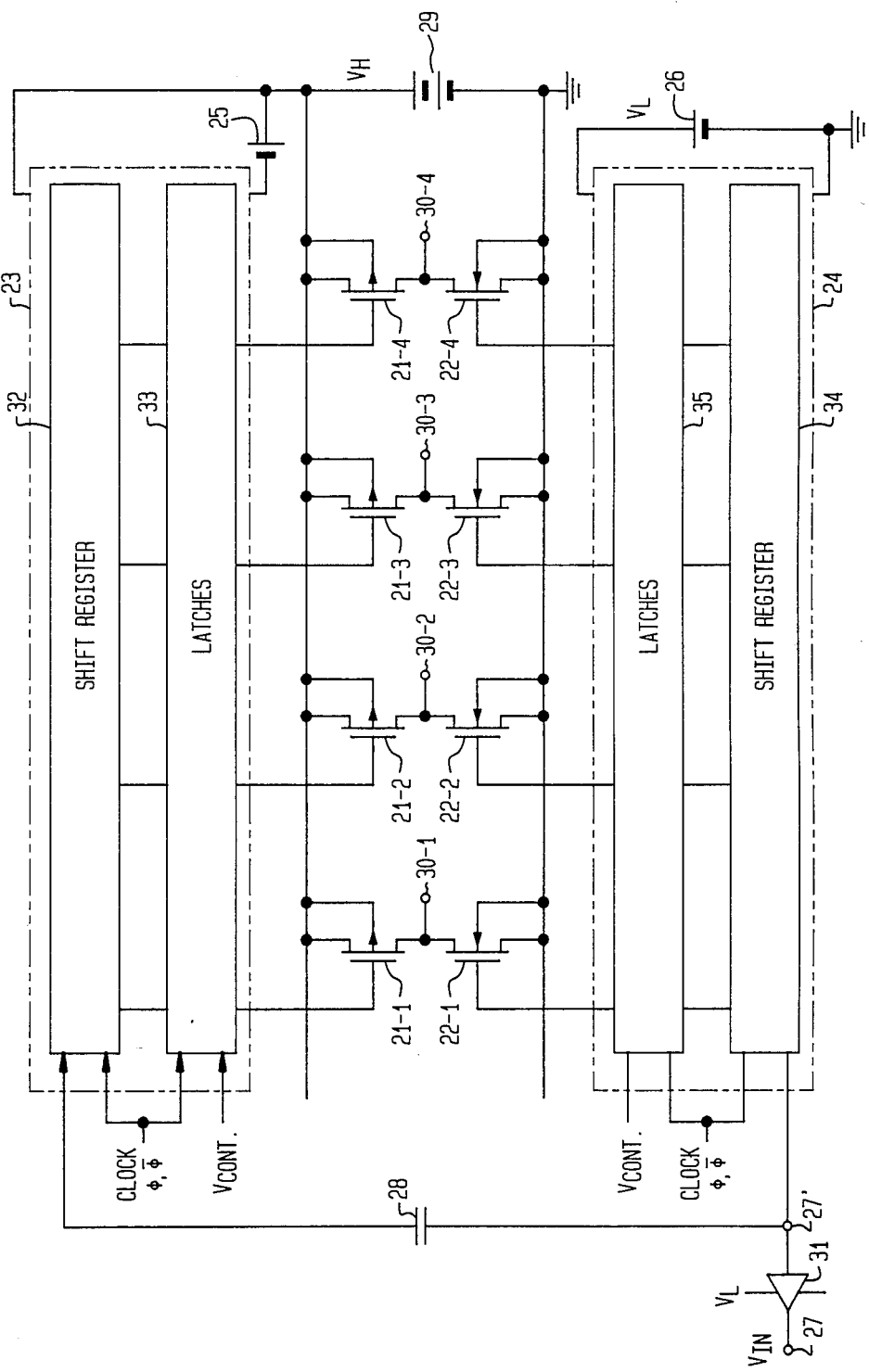
FIG. 4 is a circuit diagram showing a panel display driver using the preferred embodiment.

FIG. 4 is a panel display driver using the preferred embodiment. The panel display driver has a plurality of output stages each of which is composed of a P-channel MOS FET 21-1 (21-2, 21-3, 21-4 . . . ) and an N-channel MOS FET 22-1 (22-2, 22-3, 22-4 . . . ) to produce an output signal $V_1$ ($V_2$, $V_3$, $V_4$ . . . ) at an output terminal 30-1 (30-2, 30-3, 30-4 . . . ), for driving a plurality of display elements. The sources of the P-channel MOS FET's 21-1, 21-2, 21-3, 21-4 . . . are commonly connected to the positive pole of the high voltage power source 29 of 200 volts, for example. The sources of the N-channel MOS FET's 22-1, 22-2, 22-3, 22-4 . . . are commonly grounded.

An input signal $V_{in}$ received at an input terminal 27 is once applied to a buffer amplifier 31, and then applied to a signal processor 24 directly and to a signal processor 23 through capacitor 28. The signal processors 23 and 24 are respectively composed of a shift register 32 (34) and a latch section 33 (35). The shift registers 32 and 34 shift the received input signal in synchronism with clock signals $\phi$ and $\bar{\phi}$. A shifted signal is derived from an appropriate stage of the shift register 32 and 34 to the latch sections 33 and 35 to be temporarily stored at one of the latches. Thereafter, the stored signals are applied to the P- and N-channel MOS FET's in the corresponding output stage. The operations of the latch sections 33 and 35 are controlled by a control signal and the clock signals $\bar{\phi}$ and $\phi$. The buffer stage 31 and the signal processor 24 are energized by a low voltage power source 26 of 10 volts, for example. The signal processor 23 is energized by a low voltage power source 25.

Figure 5:
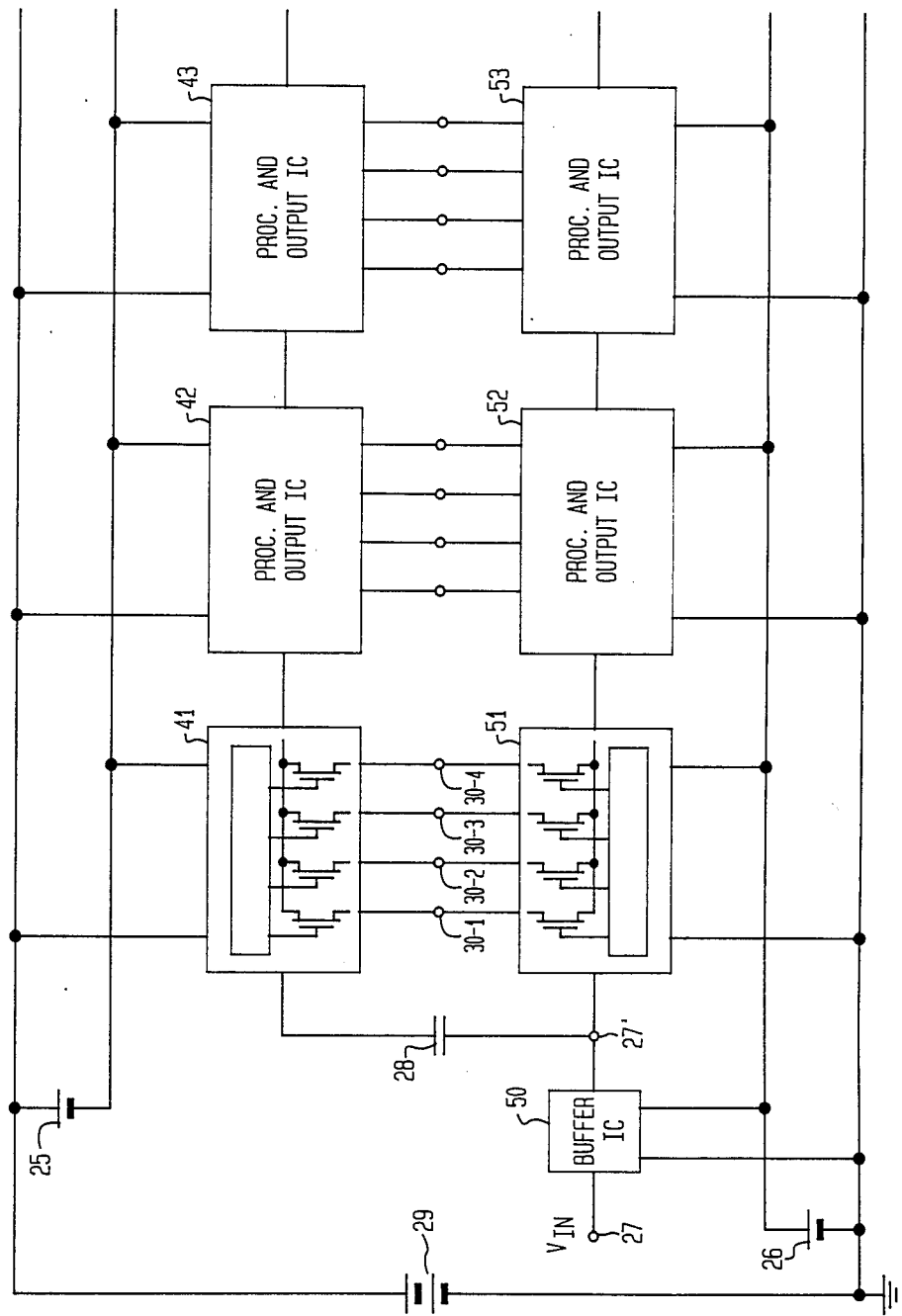
FIG. 5 is a block diagram showing one example of the panel display driver shown in FIG. 4 composed of semiconductor integrated circuits.

The panel display driver shown in FIG. 4 may be formed on two semiconductor chips. The P-channel MOS FET's 21-1, 21-2 . . . and the signal processor 23 may be commonly formed on one semiconductor chip, while the N-channel MOS FET's 22-1, 22-2 . . . , the signal processor 24 and the buffer amplifier 31 may be commonly formed on the other semiconductor chip. such a semiconductor chip, however, requires a very large number of electrode pads. Therefore, in a practical form, four or another suitable number of output MOS FET's and the corresponding part of the signal processor are formed on a semiconductor chip as the IC's 41, 42, 43 . . . , 51, 52, 53 . . . shown in FIG. 5. These divided IC's are mutually wired to form the circuit shown in FIG. 4. More specifically, the respective drains of the P-channel MOS FET's in the IC's 41, 42, 43 . . . are connected to the corresponding output terminals 30-1, 30-2, 30-3, 30-4 . . . together with the corresponding drains of the N-channel MOS FET's in the IC's 51, 52, 53 . . . . An IC 50 is the buffer amplifier 31. The output of the IC 50 is applied to the IC 51 directly and to the IC 41 through the capacitor 28.

The necessary number of the capacitor 28 for the combination of IC's is only one. This fact greatly reduces the wirings between IC's, the electrode pads on the IC chip and the cost. This fact also makes the panel display driver compact.

Figure 6:
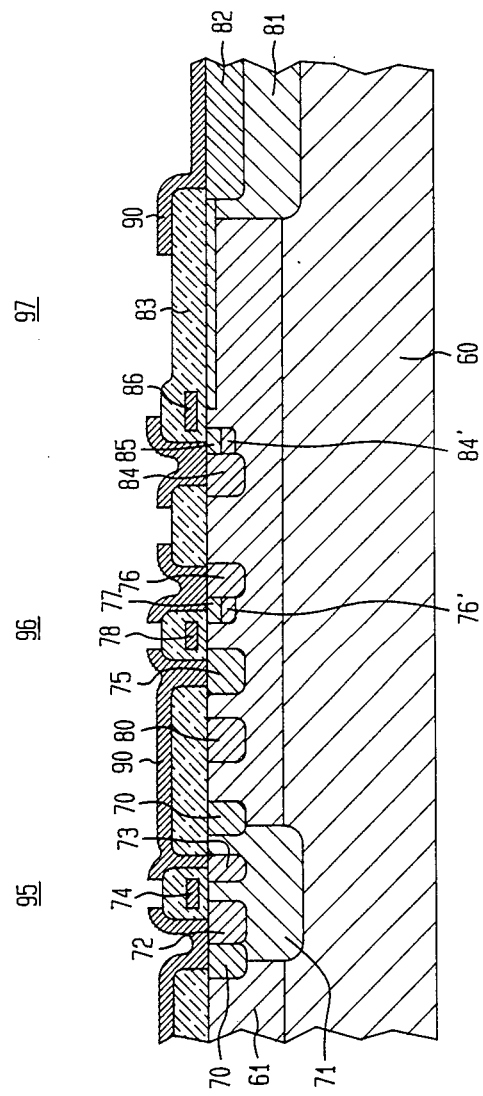
FIG. 6 is a sectional view of the circuit element using the semiconductor integrated circuit of FIG. 5.

The IC's 51, 52, 53 . . . may be formed by using the circuit elements having sectional views shown in FIG. 6. A P-type silicon having a low impurity concentration of $2 \times 10^{14}$ cm$^{-3}$, for example, is used as a substrate 60 on which P-type silicon layer 61 is epitaxially grown. A first N-well 71 is formed across the silicon layer 61. A P-channel MOS FET 95 which is used in the signal processor 24 is formed in the first N-well 71 by forming a P+-source region 72, a P+-drain region 73 and a gate electrode 74 which is deposited on the silicon layer 61 between the P+-source and drain regions 72 and 73 via a gate insulating film. The N+-region 70 formed at the periphery of the first N-well 71 is a guard ring. An N-channel MOS FET 96 which is used in the signal processor 24 is formed at a portion of the silicon layer 61 by forming an N+-source region 75, an N+-source region 75 and a gate electrode 78 disposed on the silicon layer 61 between the N+-source and drain regions 76 and 75 via a gate insulating film. The N+-source region 77 is surrounded at its outer side surface and lower surface with P+-regions 76 and 76' to form a so-called shielded source structure. The shielded source structure prevents the latch-up phenomenon of a complementary MOS structure. The P+-region 80 is a channel stopper region. The P- and N-channel MOS FET's 95 and 96 are mutually connected by a metal wiring 90 to form a complementary MOS circuit or other circuit.

A second N-well 81 is further formed for the formation of a high voltage MOS transistor using as the N-channel MOS FET's 22-1, 22-2, 22-3, 22-4 . . . . An N+-drain region 82 is formed in the second N-well 81. An extended drain region 83 of N−-type is formed at the surface of the silicon layer 61. An N+-source region 85 is formed in the surface of the silicon layer 61. A gate electrode 86 is formed on the silicon layer 61 between the N+-source and extended drain regions 85 and 83 via a gate insulating film to form the high voltage MOS transistor. The N+-source region 85 is surrounded at its outer side surface and lower surface with P+-regions 84 and 84' to form the shielded source structure. The IC+s 41, 42, 43 . . . may be similarly formed by using an N−-type silicon as a substrate and by reversing the conductivity types of all the regions in the structure shown in FIG. 6.

In the foregoing, only a specific embodiment and its application were explained, but it is apparent that the present invention is not limited to such embodiment and applications. The signal processors may have various functions in accordance with application of the circuit of the present invention. Some logic operations may be performed in the signal processors.

What is claimed is:

1. A circuit for outputting a high voltage signal comprising:
    a high voltage power source;
    a first low voltage power source;
    a second low voltage power source;
    an input terminal receiving an input signal;
    at least one first inverter circuit receiving said input signal from said input terminal, said first inverter circuit being energized by said first low voltage power source;
    a capacitor;
    at least one second inverter circuit receiving said input signal from said input terminal through said capacitor, said second inverter circuit being energized by said second low voltage power source;
    an output stage having a first output transistor and a second output transistor connected in series with said first output transistor, said first output transistor receiving a signal from said first inverter circuit, said second output transistor receiving a signal from said second inverter circuit, and said output stage being energized by said high voltage power source; and
    an output terminal for deriving said high voltage signal as an output signal from said output stage.

2. A circuit for producing a high voltage signal as claimed in claim 1, wherein said first output transistor is a MOS field effect transistor of a first channel conductivity type, while said second output transistor is a MOS field effect transistor of a second channel conductivity type.

3. A circuit for producing a high voltage signal as claimed in claim 2, wherein said first inverter circuit and said first output transistor in said output stage are formed on a semiconductor chip, while said second inverter circuit and said second output transistor in said output stage are formed on another semiconductor chip.

4. A circuit for producing a high voltage signal as claimed in claim 2, wherein said first and second inverter circuits are plural and constitute shift registers, respectively.

5. A circuit comprising;
    an input terminal receiving an input signal;
    a high voltage power source;
    a first low voltage power source;
    a second low voltage power source;
    a first signal processor receiving said input signal from said input terminal, said first signal processor being energized by said first low voltage power source, said first signal processing circuit including a first shift register which has a plurality of shift stages and shifts said input signal through said shift stages;
    a capacitor;
    a second signal processor receiving said input signal from said input terminal through said capacitor, said second signal processor being energized by said second low voltage power source, said second signal processing circuit including a second shift register which has a plurality of shift stages and shifts said input signal through said shift stages;

a plurality of first MOS output transistors of a first channel conductivity type, each having a gate receiving a signal from the corresponding shift stage of said first shift register, a drain and a source;

a plurality of second MOS output transistors of a second channel conductivity type, each having a gate receiving another signal from the corresponding shift stage of said first shift register, a drain and a source, an electrical path between said drain and said source of each of said first MOS output transistors being connected in series with an electrical path between said drain and said source of a corresponding one of said second MOS output transistors, and said series connections being energized by said high voltage power source; and a plurality of output terminals each of which is connected to the connecting point of a corresponding one of said series connections.

6. A circuit as claimed in claim 5, wherein said first and second signal processors respectively further include a plurality of latches each of which temporarily stores the shifted signal and each of which supplies the stored signal to one of said first and second MOS output transistors.

7. A circuit as claimed in claim 5, wherein said first signal processor and said first MOS output transistors are formed on a semiconductor chip, while said second signal processor and said second MOS output transistors are formed on another semiconductor chip.

8. A circuit as claimed in claim 6, wherein said first signal processor and said first MOS output transistors are formed on a semiconductor chip, while said second signal processor and said second MOS output transistors are formed on another semiconductor chip.

* * * * *